United States Patent [19]

Charlet et al.

[11] Patent Number: 4,920,279

[45] Date of Patent: Apr. 24, 1990

[54] METHOD TO EXPAND AN ANALOG SIGNAL AND DEVICE TO IMPLEMENT THE METHOD

[75] Inventors: Pascal Charlet, Gardanne; Eric Lauverjat, Tours; Rafaël Moreno, Marseille, all of France

[73] Assignee: SGS Thomson Microelectronics SA, Gentilly, France

[21] Appl. No.: 250,392

[22] Filed: Sep. 28, 1988

[30] Foreign Application Priority Data

Oct. 6, 1987 [FR] France .................. 87 13784

[51] Int. Cl.⁵ .................. H03L 5/00; H03K 5/01
[52] U.S. Cl. .................. 307/264; 307/360; 307/268; 307/529; 328/168; 328/162
[58] Field of Search .................. 307/529, 264, 268; 328/115, 117, 168, 173, 175

[56] References Cited

U.S. PATENT DOCUMENTS

| 3,643,171 | 2/1972 | Chang | 328/165 |
| 4,298,841 | 11/1981 | Dishal | 328/117 |
| 4,736,163 | 4/1988 | Berkhout et al. | 328/162 |

Primary Examiner—Stanley D. Miller
Assistant Examiner—Timothy P. Callahan
Attorney, Agent, or Firm—Roland Plottel

[57] ABSTRACT

A method for enlarging part of an analog input signal, and a circuit to implement this method. The circuit includes an amplifier which receives the analog input signal, the gain of which is controlled by a programming signal which varies as a function of the leading edge of the analog input signal and of a maximum threshold of the output signal from the circuit. A subtractor receives a substraction signal which is a function of an upper threshold and a lower threshold of the output signal from the circuit, and a signal from the amplifier, and then provides the output signal from the circuit.

5 Claims, 3 Drawing Sheets

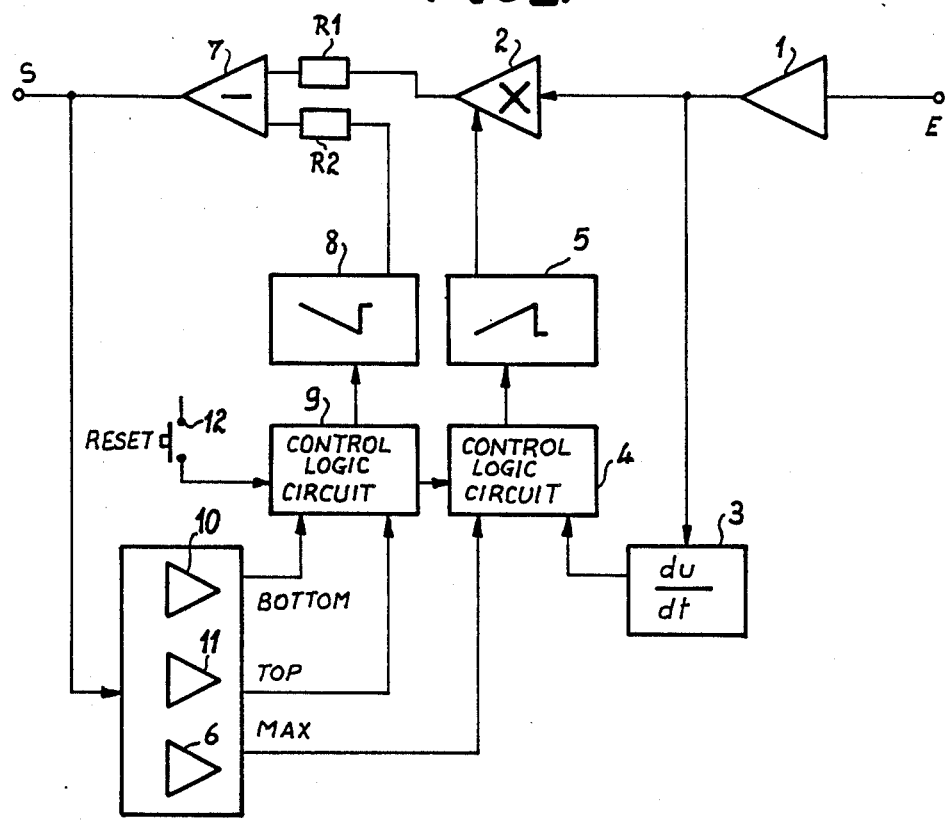
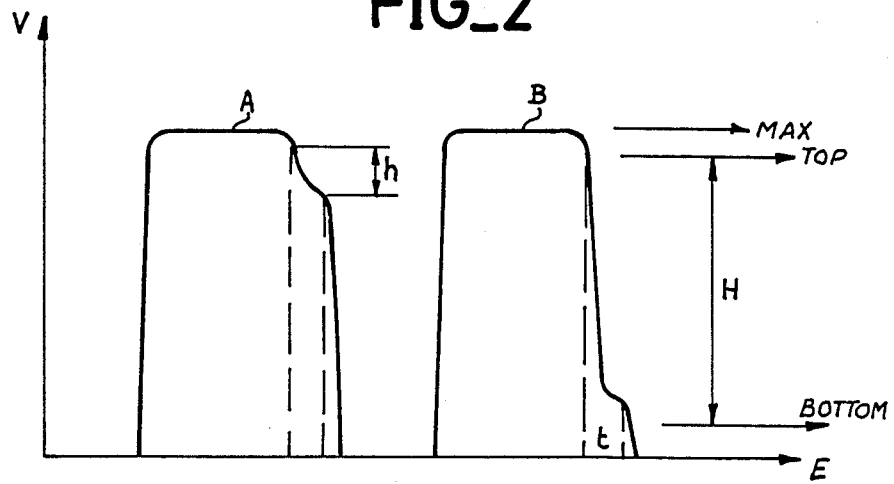

FIG_3
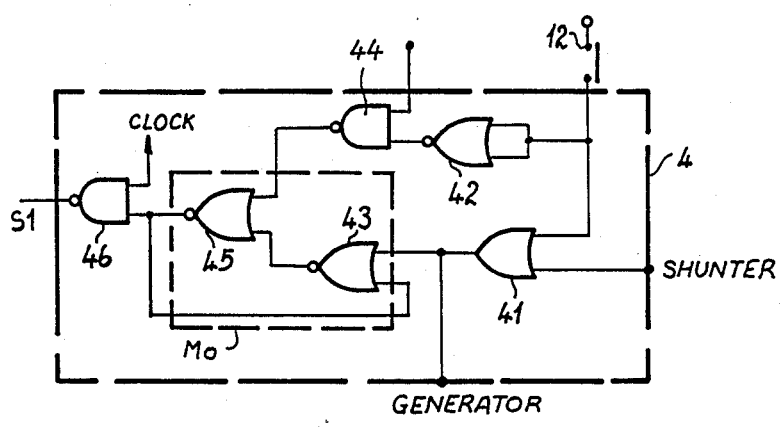
FIG_4
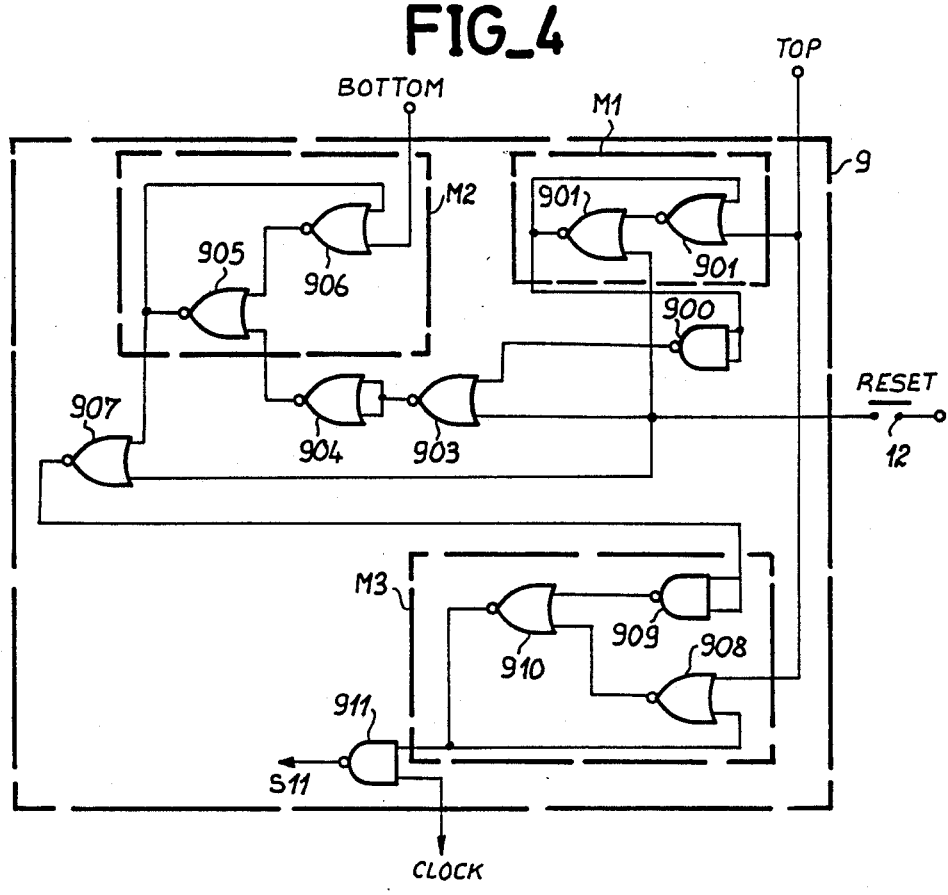

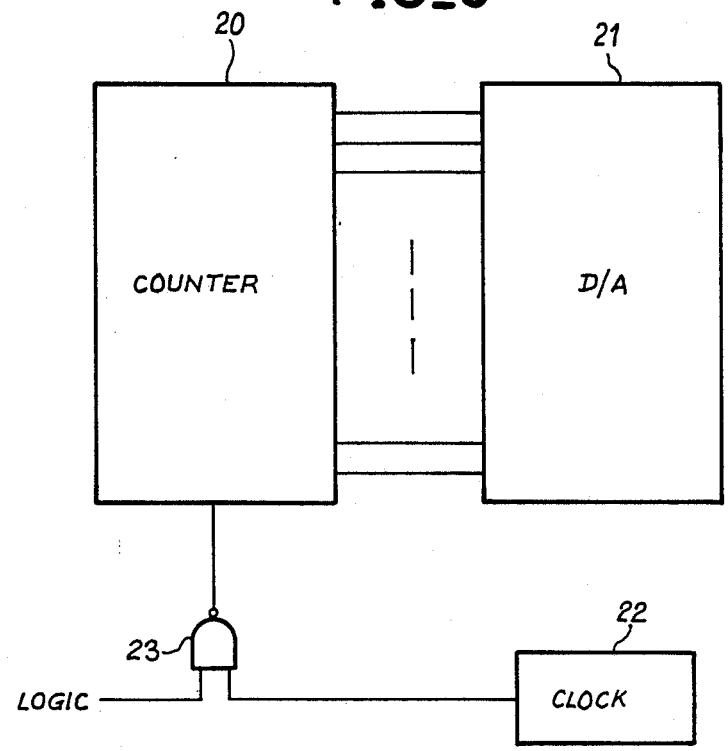
FIG_5
FIG_6

METHOD TO EXPAND AN ANALOG SIGNAL AND DEVICE TO IMPLEMENT THE METHOD

BACKGROUND OF THE INVENTION

1. Field of the Invention

The present invention concerns a method to expand an analog signal and, more particularly, to expand at least one part of an analog signal which is substantially rectangular or square shaped. It also concerns a device to implement this method.

2. Description of the Prior Art

In certain manufacturing methods, it is useful to be able to expand or enlarge at least one part of an analog signal in order to use this part of the signal as a control element in the manufacturing process. Thus, in semi-conductor technology, during the etching process, photomultipliers are used to convert a light intensity into an analog electrical signal which is then processed by a computer. Now, the valuable part of the analog signal given out by the photomultiplier has an amplitude of some millivolts. This part of the signal must therefore be levelled so that it can subsequently be used.

The presently used device consists of an operational amplifier, the gain and zero shift of which are achieved by means of two potentiometers. This is therefore a manual system which needs to be set at each process and product change.

An object of the invention, therefore, is to propose a method for the expansion of at least one part of an analog signal which is substantially rectangular or square shaped, which automatically levels the analog signal.

Another object of the present invention is to propose a device to implement the expansion method of the present invention. This device has the advantage of automatically checking the gain and of automatically shifting the zero of the input analog signal.

Consequently, the present invention relates to a method for the expansion of at least one part of an input analog signal which is substantially rectangular or square shaped, said method consisting in multiplying the input signal by a programming signal which is a function of the rising edge of the analog signal and of a maximum threshold, and then subtracting a subtraction signal, which is a function of a top threshold and a bottom threshold.

According to another feature of the present invention, the programming signal is computed for each analog signal while the subtraction signal is computed during the emission of a resetting signal and then memorized and used for the following analog signal.

According to a preferred embodiment, the programming signal consists of a slope signal which starts at the detection of the rising edge of the analog signal and stops when the output signal corresponds to the maximum threshold, the slope gradient depending on a clock signal, and the subtraction signal consists of a slope signal which starts when the output signal corresponds to a top threshold and stops when the output signal corresponds to a bottom threshold, the slope gradient depending on a clock signal.

The present invention also relates to a device to implement the above method, comprising an amplifier that receives the input signal, the gain of which is controlled by a programming signal, means to generate the programming signal as a function of the rising edge of the analog signal and of a maximum threshold, a subtractor receiving the output signal from the amplifier and a subtraction signal and means to generate the subtraction signal as a function of a top threshold and a bottom threshold.

According to a preferred embodiment of the device, the means to generate the programming signal comprise a slope generator giving the programming signal; a first control logic circuit controlling the various operations of resetting, starting, stopping the slope generator and memorizing the signal; a derivative computing circuit receiving the analog signal as an input and applying a starting pulse to the control logic circuit; and a first comparator comparing the output analog signal with a maximum threshold and sending to the control logic circuit a stop signal.

The means to generate the subtraction signal comprise a slope generator delivering the subtraction signal; a second control logic circuit controlling the different operations for resetting, starting, stopping the slope generator and memorizing the signal; a second comparator comparing the output analog signal with a top threshold and sending the starting pulse to the control logic circuit; and a third comparator the output analog signal with a bottom threshold and sending a stop signal to the control logic circuit.

Furthermore, the second control logic circuit further has a reset circuit starting up the means for generating the subtraction signal signal and means to memorize the subtraction signal obtained until a new resetting operation of the reset circuit is performed.

Preferably, the slope generators consist of a digital counter connected to a digital/analog converter and a clock circuit determining the slope gradient.

According to another feature of the present invention, the device further has means for preamplifying and shaping the input analog signal.

BRIEF DESCRIPTION OF THE DRAWINGS

Other features and advantages of the present invention will emerge from the following description of a preferred embodiment, made with reference to the appended figures, of which:

FIG. 1 is a block diagram of a device to expand at least one part of an analog signal, for the implementation of the method of the present invention, FIG. 2 shows the curves V=f(t) at the input and output terminals of the device of FIG. 1, FIG. 3 is a diagram of an embodiment of the first control logic circuit used in the device of FIG. 1, FIG. 4 is a diagram of an embodiment of the second control logic circuit used in the device of FIG. 1, FIG. 5 is a diagram of a memorizing cell used in the control logic circuits and, FIG. 6 is a diagram of an embodiment of the slope generators used in the device of FIG. 1.

DESCRIPTION OF PREFERRED EMBODIMENTS

To simplify the description, the same reference number is repeated for the same element in all the figures. Furthermore, in the present invention, the term "rectangular or square shaped analog signal" means an analog signal which, in particular, has a steep rising edge while the descending edge may be less steep.

As shown in FIG. 1, the device used to implement the method, according to the present invention, for expanding at least one part of a substantially rectangular or square shaped analog signal essentially comprises one automatic gain control stage and one levelling stage. The automatic gain control stage consists of an amplifier 2 receiving an input analog signal E to be processed. Preferably, the analog signal E will have been shaped and preamplified by means of a known type of preamplifier 1. Furthermore, the output signal of the preamplifier is applied to a derivative computing circuit 3 which provides a control pulse to a control logic circuit 4 when detecting the rising edge of the analog signal E. The control logic circuit 4 also receives a pulse from a comparator 6 which compares the output S of the device with a maximum threshold MAX. The output signal of the logic circuit 4 is applied to a positive slope generator 5, the output of which controls the gain of the amplifier 2. Furthermore, the levelling stage essentially comprises a subtractor 7, with one of its output terminals connected via a resistor R1 to the output terminal of the amplifier 2 and with its other input terminal connected via a resistor R2 to means for generating the subtraction signal. The latter means consist essentially of a slope generator 8 connected via the resistor R2 to the subtractor 7 and giving the subtraction signal. This slope generator 8 is connected to a control logic circuit 9 controlling the different operations of resetting, starting, stopping the slope generator and memorizing the signal. The control logic circuit 9 is thus connected to two comparators 10 and 11 which provide control signals. The comparator 10 receives the output signal S at one of its input terminals and compares this signal with a fixed bottom threshold, while the comparator 11 receives the output signal S at one of its input terminals and compares this signal with a fixed top threshold. Furthermore, the control logic circuit 9 is connected to a reset button 12 (RESET) that provides a resetting signal used to initialize its operation. The signal provided by the reset button, 12 is also applied to the control logic circuit 4 via the control logic circuit 9.

The operation of the device of FIG. 1 is explained below.

The input analog signal E, after being shaped and preamplified in the preamplifier 1, is applied to the derivative computing circuit 3 which, when it detects the rising edge of the analog signal, applies a pulse to the control logic circuit 4. As explained in greater detail below, the control logic circuit 4 consists of several logic gates which, on receiving a pulse from the derivative computing circuit 3, apply a starting signal to the slope generator 5. The signal coming from the slope generator 5 is used as a signal for programming the gain of the amplifier 2, which receives an input signal coming from the preamplifier 1. Thus, the signal E is amplified by the amplifier 2, the gain of which is programmed by a slope which starts at the detection of the rising edge of the input analog signal. Furthermore, the output signal S of the device is compared in the comparator 6 to a maximum threshold set by the operator. When the output signal S reaches this maximum threshold, the comparator 6 applies a control pulse to the control logic circuit 4. This control pulse is transmitted to the slope generator 5 so as to stop the slope at the set threshold. Furthermore, the control logic circuit 4 has a memorizing loop. Consequently, once the output signal has reached the set threshold, the programming signal is set. The signal may then vary, but the gain will no longer vary throughout the transmission of the analog signal. This automatic gain control operation is performed whenever there is a new analog signal. Furthermore, whenever the reset button 12 is pressed, the device of FIG. 1 also performs a new zero shift. For this purpose, a subtraction signal coming from the slope generator 8 is subtracted from the signal coming from the amplifier 2. When the trailing edge of the output signal S, reaches a value corresponding to the top threshold, the comparator 11 applies a signal to the control logic circuit 9 which starts up the slope generator 8. This slope generator 8 works until the output signal S reaches a value corresponding to the bottom threshold. At this moment, the comparator 10 applies to the control logic circuit 9 a signal which stops the operation of the slope generator 8. The slope generator 8 thus generates a voltage which is subtracted from the signal coming from the amplifier 2 in the subtractor 7. The value of this voltage is actually memorized in the logic circuit 9 and can be used for several analog signals. A new computation of the zero shift is performed each time the reset button 12 is used.

Thus, with the above device, if the input analog signal E has the shape shown by the curve A wherein the useful part is the part represented by the amplitude h and the duration t, at the output terminal 5 of the device of the present invention, there is obtained the curve B enlarged in proportions that are defined by the values given to the different thresholds. Thus, the maximum threshold is used to adjust the level of the output voltage, and the top and bottom thresholds are used to adjust the amplitude h of the output analog signal, regardless of the amplitude h, by performing a zero shift.

Referring to FIG. 3, there will now be described an embodiment of the control logic circuit 4 used to determine the signal for programming the automatic gain control amplifier. The control logic circuit 4 consists of an OR gate 41 which receives the signal coming from the derivative computing circuit at one of its input terminals and the signal coming from the reset button at its other input terminal. The output signal of the OR gate 41 is applied to one input terminal of a NOR gate 43, the other input terminal of which receives a looping signal. The output signal of the NOR gate 43 is applied to one input of a NOR gate 45. Furthermore, the signal provided by the reset push-button 12 is also applied to the two input terminals of a NOR gate 42, the output of which is applied to one input terminal of a NAND gate 44, the other input terminal of which receives the signal MAX coming from the comparator 6. The output signal of the NAND gate 44 is applied to the other input terminal of the NOR gate 45. The output signal of the NOR gate 45 is applied as a looping signal to the second input terminal of the NOR gate 43. In fact, the two NOR gates 45 and 43 constitute a memory cell MO and perform a memorizing function as shall be explained below. Furthermore, the output signal of the NOR gate 45 is applied to one input of a NAND gate 46 which receives, at its other input terminal, a clock signal which determines the gradient of the slope generator 5 as shall be explained below. The output signal of the NAND gate 46 is applied as a command for the slope generator 5.

As shown in FIG. 5, the memory cell MO is made by means of two NOR gates 45 and 43. The NOR gate 45 has a first input terminal $E_1$ and receives the output signal of the NOR gate 43 on its second input terminal. This gate has an input terminal $E_2$ and receives the output signal of the NOR gate 45 at its other input terminal.

With the above-described memory cell, in order to obtain a logic level "1" at the output S', the input terminal $E_1$ should be at the logic level "O" and the input terminal $E_2$ should be at the logic level "1". When the output terminal of the NOR gate 45 is at the logic level "1", the input terminal $E_2$ may be at any level. The output S' goes to the logic level "0" when the input terminal $E_1$ goes to the level "1". With this circuit, the input terminal $E_1$ is used for validation and resetting, and it is the top level of the input terminal $E_2$ which is memorized.

Thus, in the example of FIG. 3 when the derivative computing circuit goes to the logic level "1" or when the reset button 12 goes to the logic level "1", the output terminal of the gate 41 is positioned at the logic level 1. Thus, the system is in a condition which enables the memory cell M0 to be activated. Moreover, to activate the memory cell M0, the output terminal of the NAND gate 44 should be at the logic level "0". In this case, the input terminal MAX is at the logic level "1" and the output terminal of the NOR gate 42 is also at the logic level "1". This is the case when the reset button 12 is not actuated. Thus, so long as the signal MAX is at the logic level "1" and the reset button 12 is not actuated, the output terminal of the NOR gate 45 is at the logic level "1" and enables the clock signals to go through the NAND gate 46. This causes the operation of the slope generator. When the signal MAX goes to the logic level "0" or when the reset button 12 is actuated, the output terminal of the gate 44 goes to the logic level "0" causing the output terminal of the gate 45 to go to the logic level "0" and the slope generator to be stopped.

Referring to FIG. 4, there will now be described an embodiment of the control logic circuit 9 used to control the slope generator 8 giving the subtraction signal. This control logic circuit essentially consists of a NOR gate 901 receiving the signal from the top threshold comparator 11 at one of its input terminals. The output terminal of the NOR gate 901 is connected to an input terminal of a NOR gate 902, the other input terminal of which receives the signal provided by the reset push-button 12. The output terminal of the NOR gate 902 is looped with the second input terminal of the NOR gate 901 and is connected to the two input terminals of a NAND gate 900. The output signal of the NAND gate 900 is applied to one input terminal of a NOR gate 903 which receives the signal provided by the reset push-button 12 at its other input terminal. The output terminal of the NOR gate 903 is connected to the two input terminals of a NOR gate 904, the output terminal of which is connected to one input terminal of a NOR gate 905. The other input terminal of the NOR gate 905 receives the output signal of a NOR gate 906 which receives the signal provided by the bottom threshold comparator 10 at one of its input terminals. The output terminal of the NOR gate 905 is looped with the second input terminal of the NOR gate 906. Furthermore, the output signal of the NOR gate 905 is applied to one input terminal of a NOR gate 907 which receives the signal provided by the reset push-button 12 at its other input terminal. The output signal of the NOR gate 907 is applied to the two input terminals of a NAND gate 909. The output signal of the NAND gate 909 is applied to an input terminal of a NOR gate 910, the other input terminal of which receives the output signal of a NOR gate 908. The NOR gate 908 receives the signal provided by the top threshold comparator at one of its input terminals. The other input terminal of this NOR gate 908 receives the output signal of the looped NOR gate 910. A NAND gate 911 receives the output signal of the NOR gate 910 on one of its input terminals and a clock signal at its other input terminal. The output S11 of the NAND gate 911 is applied as a control signal to the slope generator 5. In the above circuit, the NAND gates 901 and 902 form a first memory cell M1. The NOR gate 906 and the NOR gate 905 form a second memory cell M2 and the NOR gates 910 and 908 form a third memory cell M3. These memory cells are identical to the memory cell M0 shown in FIG. 5 and work identically.

In this circuit of FIG. 4, the top level of the signal marked "top", coming from the top threshold comparator, is memorized in the memory cells M1 and M3. Moreover, the top level of the signal marked "bottom", coming from the bottom threshold comparator, is memorized in the memory cell M2. The memory cell M1 is validated and reset by the signal RESET. The memory cell M2 is validated and reset by a signal which is a logic function of the reset signal and of the signal coming from the memory cell M1, and the memory cell M3 is validated and reset by a signal which is a logic function of the RESET signal and of the signal coming from the memory cell M2. Thus, when the reset button is pressed, the different memory cells are reset. Then, when the top signal goes to the logic circuit level "1", the RESET signal being at the logic level "0", the output terminal of M1 goes to the logic circuit level "1". The output terminal of the NAND gate 900 goes to the logic level "0". The output terminal of the NOR gate 903 is at the logic level "1" and the output terminal of the NOR gate 904 is at the logic level "0". The bottom signal coming from the bottom level comparator is at the logic level "0" and the output terminal of the memory cell M2 remains at the logic level "0". The output terminal of the NOR gate 907 is at the logic level "1" and the output terminal of the NAND gate 909 is at the logic level "0". Consequently, the output terminal of the memory cell M1 goes to the logic level "1" permitting the operation of the slope generator 8. When the bottom threshold comparator detects the bottom level, the bottom signal goes to the logic level "1" and the output terminal of the memory cell M2 then goes to the logic level "1", making the output of the memory cell M3 flip over to the logic level "0", thus stopping the operation of the clock circuit. The circuit is started up only at a new resetting operation.

Furthermore, referring to FIG. 5, there will now be described an embodiment of a slope generator which can be used as either the slope generator 8 or the slope generator 5. The slope generator essentially consists of a counter 20, the output terminals of which are connected to a digital/analog converter 21. The counting frequency is determined by a clock 22. The output terminal of the clock circuit 22 is applied to one input terminal of a NAND gate 23, the other input terminal of which receives a signal coming from the control logic circuit. The control logic circuit may consist of either the control logic circuit 9, shown in detail in FIG. 4, or the control logic circuit 4, shown in detail in FIG. 3.

The above device as well as the method described make it possible, by means of a gain control and a zero shift, to bring to scale all the repetitive analog signals provided that the input signal has a rising edge and a trailing edge which are sufficiently steep.

What is claimed is:

1. A method for automatically modifying the shape of part of an analog signal for emphasizing a specifically interesting portion of the signal, said signal being successively an initial pulse followed by substantially rectangular shaped pulses having a fast rise time and a fast fall time, said method comprising multiplying each pulse of the input signal by a variable coefficient depending on the rise time of said respective pulse, for obtaining an intermediate amplified signal; and subtracting a value from the intermediate amplified signal, for obtaining an output signal, said subtracted value being constant from one pulse to another and being defined by a ramp signal starting when the output signal corresponding to said initial pulse signal reaches a first threshold and stopping when said last mentioned output signal reaches a second threshold.

2. A device for implementation of the method of claim 1, comprising an amplifier having an input for receiving said analog signal, said signal comprising a succession of pulses of a generally rectangular shape, and an output for delivering an intermediate amplified signal; and a subtractor for subtracting a value from the intermediate amplified signal and producing an output signal; said amplifier having a gain controlled by a first ramp signal, said ramp signal generated by first ramp generating means, said first ramp generating means controlled by the rising edge of each pulse of said analog signal and controlled by a first threshold detection means receiving the output signal, said subtracted value being determined by a second ramp signal generated by second ramp generating means, said second ramp generating means being controlled by a second and third threshold detection means receiving said output signal.

3. A device according to claim 2, wherein said first ramp generating means is actuated for producing said first ramp at each occurrence of a new pulse in the analog signal, whereas said second generating means is actuated for producing said second ramp only during occurrence of an initial pulse, said subtracted value being maintained constant thereafter for the subsequent pulses.

4. A device according to claim 2 and 3, wherein the slope of the ramp signals are controlled by clock signals.

5. A device according to claim 2, wherein said threshold values are adjustable for defining a specifically interesting portion of the pulses of the analog signals.

* * * * *